United States Patent [19]

Carbrey

[11] Patent Number: 4,570,121
[45] Date of Patent: Feb. 11, 1986

[54] VIDEO WAVE CODEC

[75] Inventor: Robert L. Carbrey, Boulder, Colo.

[73] Assignee: AT&T Bell Laboratories, Murray Hill, N.J.

[21] Appl. No.: 504,900

[22] Filed: Jun. 16, 1983

[51] Int. Cl.[4] .......................................... H03K 13/09
[52] U.S. Cl. ...................... 340/347 C; 340/347 AD; 340/347 NT
[58] Field of Search .................. 340/347 AD, 347 NT

[56] References Cited

U.S. PATENT DOCUMENTS

| | | | |
|---|---|---|---|
| 3,631,468 | 12/1971 | Spaid | 340/347 AD |
| 3,651,518 | 3/1972 | Carbrey | 340/347 AD |
| 4,072,938 | 2/1978 | Buchanan | 340/347 AD |
| 4,185,275 | 1/1980 | Carbrey | 340/347 |
| 4,369,433 | 1/1983 | Yamakido | 340/347 AD |
| 4,404,544 | 9/1983 | Dwarakanath | 340/347 AD |

Primary Examiner—B. Dobeck
Attorney, Agent, or Firm—Jack S. Cubert; Howard R. Popper

[57] ABSTRACT

An analog-to-digital converter circuit is disclosed employing a plurality of comparators each having the same reference voltage input. At each comparator stage plus and minus binary "bit weights" are developed. Selection of either the positive or negative bit weights at a stage allows a binary fraction to be added or subtracted. The number of comparator stages need only equal the number of desired digit positions in the output instead of having one comparator for each quantizing level. The comparator stages operate in a "wave" or "pipeline" manner under the control of a plurality of high speed wave forms so that each stage decodes its respective binary digit for one analog sample while the other stages are decoding their respective binary digits of other analog samples.

9 Claims, 3 Drawing Figures

VIDEO WAVE CODEC

TECHNICAL FIELD

This invention relates to analog to digital coders and decoders and, more particularly, to such coders and decoders of the capacitive type.

BACKGROUND OF THE INVENTION

In my previous U.S. Pat. No. 4,185,275 issued Jan. 22, 1980, there is disclosed a multi-stage digital-to-analog converter which employs a sampling capacitor for each stage of coding. A reference terminal of the sampling capacitor is connected to a tap of a precision resistive divider providing a binary-weighted reference voltage for the stage. The other terminal of the sampling capacitor receives the input sample to be quantized by the stage. A comparator compares the analog sample that is input to the stage with the reference voltage for the stage. If the input sample is at a higher voltage than the reference voltage at the tap, a flip-flop is set for the stage and the reference terminal of the sampling capacitor is disconnected from the reference tap and clamped to ground to "subtract" an increment from the sample. If the voltage of the input analog sample is lower than the reference voltage, the flip-flop is not set and the reference terminal of the capacitor is not clamped to ground. In either event, the input terminal of the sampling capacitor is then connected to the input of the next stage where the process is repeated, except that the reference terminal of the second stage's capacitor is connected to a tap of the resistive divider offering a lower, binary-weighted reference voltage.

While the foregoing circuit is satisfactory for many applications, it would be advantageous to employ integrated CMOS or NMOS technology. However, it is difficult to provide a precision resistive divider using that technology, moreover, even were it possible to provide an integrated precision voltage divider, each comparator of the prior art circuit would receive different reference voltage inputs from the divider causing possible variation in the performance characteristics of the comparator. All of the comparators should have the same sensitivity and accuracy in order to maintain the monotonicity of the encoding and decoding levels.

SUMMARY OF THE INVENTION

The precision resistive voltage divider for supplying the reference voltage required for each stage of the prior art analog-to-digital converter is eliminated in accordance with my present invention by a switched capacitor divider network. The division takes place in such a manner that all of the comparators have the same reference voltage input, thereby eliminating the precision problem arising from a different reference voltage at each comparator input. Plus and minus binary "bit weights" are developed at each stage in the division process. Selection of either the positive or negative bit weight at a stage allows a binary fraction to be added or subtracted thereby replacing the weighting function of the resistive divider in my prior art patent.

In the illustrative embodiment of the invention, capacitive division of a dc input voltage, $+V_r$ to $-V_r$, is propagated through a plurality of stages. The switching sequence used in the dividing operation develops the required binary bit weights to be used in the wave type sequential approximation coding process. Then the pairs of divider capacitors are switched to the center reference voltage capacitor to refresh that common reference input for each of the comparators. As with the coder of my previously cited patent, the number of stages advantageously need only be equal in number to the number of desired digit positions in the output. This is in contrast to present practice where one comparator is required for each quantizing level.

The stages are arranged to operate in a "wave" or "pipeline" sequence under the control of a plurality of high speed waveforms so that each stage decodes its respective binary digit for one analog sample while the other stages are decoding their respective binary digits of other analog samples. One set of waveforms control the transfer of the analog sample from stage to stage while another set of waveforms control the capacitive division of voltage for each stage. At each stage a comparator determines whether the analog input applied to a sampling capacitor for the stage is positive or negative. The analog sample is applied to the next stage after the comparator controls the adding of a binary-weighted voltage to the input if it was negative or the subtracting of a binary-weighted voltage if the input was positive. Adding or subtracting the appropriate binary bit weight value forces the result toward the center reference voltage of all comparators. As a result the critical decision in a coding cycle is made at that comparator which has as input a result which is within one quantizing level of the shared comparator reference. At each stage a flip-flop associated with the comparator is set to "1" whenever the comparator decision is to subtract the binary-weighted voltage and to "0" whenever the decision is made to add the binary-weighted voltage.

In one exemplary embodiment, in addition to the comparator, each stage includes a voltage divider capacitor circuit. During a first control phase, the voltage divider capacitor circuit for a given stage is discharged while the voltage divider capacitor for the preceding stage is charged to a first reference value. During the next (second) control phase the given stage's voltage divider capacitor is connected in parallel with the equal-size voltage divider capacitor of the preceding stage to establish a binary-weighted voltage for the prior stage which will be added to or subtracted from the voltage sample on that stage's sampling capacitor. During the third phase, the parallel connection is opened, the prior stage binary-weighted voltge is added to or subtracted from its analog input sample, and the voltage divider capacitor for the given stage is connected in parallel with the voltage divider capacitor of the succeeding stage.

BRIEF DESCRIPTION OF THE DRAWING

The foregoing objects and features may become more apparent from a reading of the ensuing description, together with the drawing, in which.

DETAILED DESCRIPTION

Figure 1:
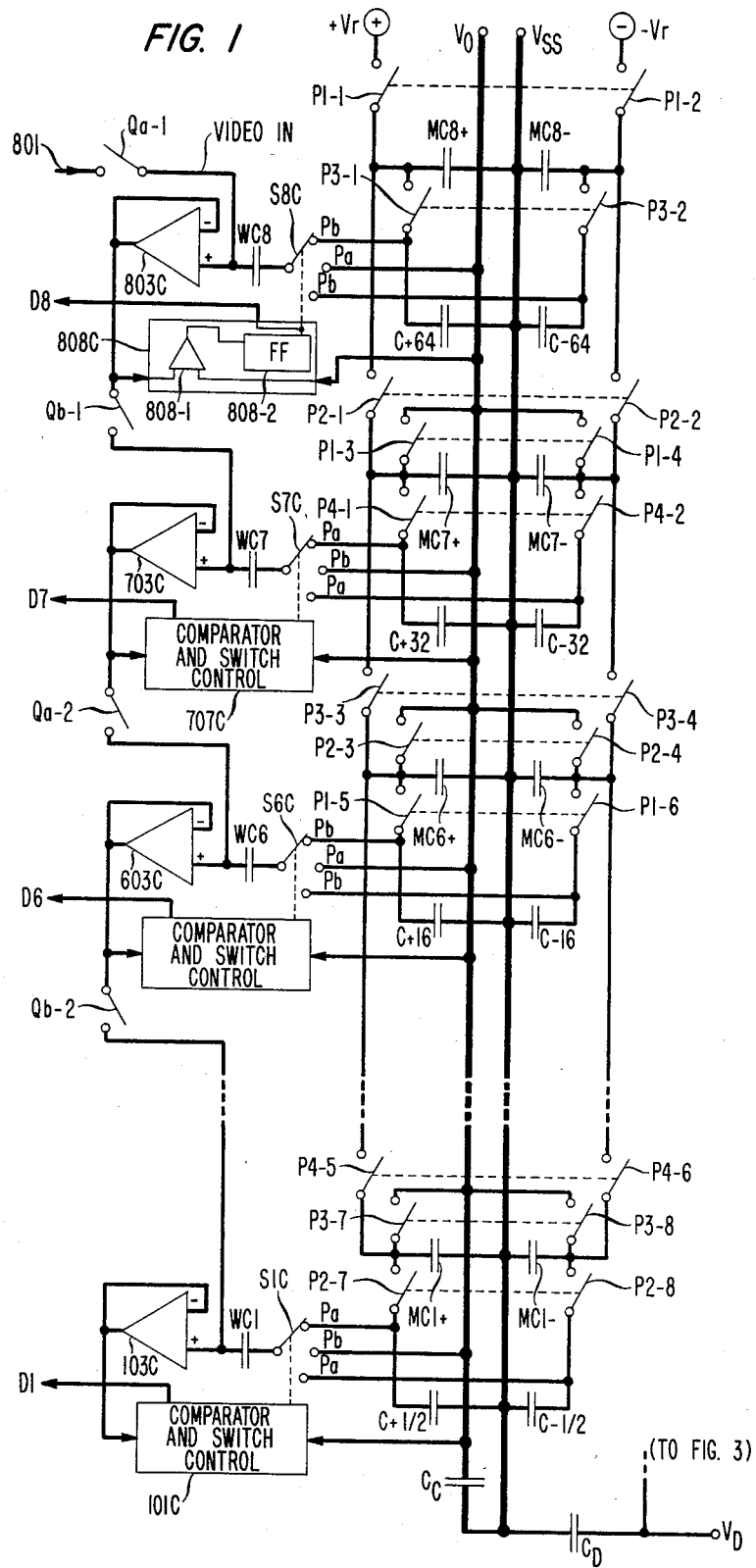
FIG. 1 shows an 8-stage analog-to-digital encoder according to my invention.

Referring now to FIG. 1, the first three and the last of eight stages of an analog-to-digital encoder are shown. The analog input signal is applied at terminal 801 at the upper left-hand corner of the drawing and is converted into an 8-bit digital output signal which sequentially appears at output terminals D8 through D1 located below terminal 801.

Figure 2:
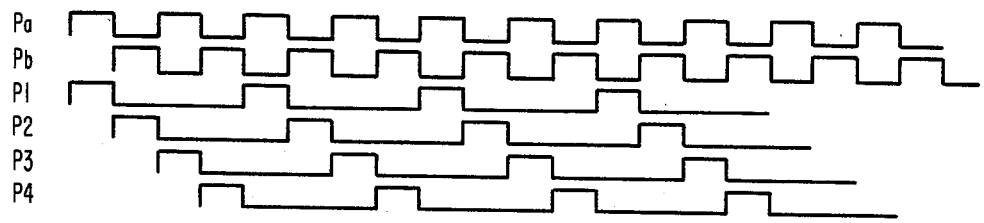
FIG. 2 shows the waveforms for controlling the operation of the encoder of FIG. 1 and encoder/decoder of FIG. 3.

The eight stages operate in sequential or "pipeline" manner under the control of the waveforms of FIG. 2. All of the capacitors, buffer amplifiers, switches and comparator and control circuitry of the exemplary embodiment are advantageously fabricated using integrated circuit technology and may be incorporated in a single chip. The frequency of the highest frequency waveforms, Pa and Pb, of FIG. 2 may be taken to be 10 mHz, although higher or lower rates may be used, as permitted by the wave propagation characteristics of the integration technology utilized.

Each of the stages includes a group of switches controlled during waveforms Pa or Pb and a group of switches controlled during waveforms P1, P2, P3 or P4 of FIG. 2. With respect to the input stage, for example, switches P1-1 and P1-2 are controlled during waveform phase P1 and switches P3-1 and P3-2 are controlled during waveform phase P3. Switch S8C is controlled during waveform phases Pa and Pb. In the second stage, switch S7C is controlled during waveforms Pa and Pb, switches P2-1 and P2-2 are controlled during waveform phase P2 and switches P4-1 and P4-2 are controlled during waveform phase P4.

Before describing the manner in which the input analog signal that is applied at terminal 801 is encoded, it will be advantageous to understand the function of the switches which are controlled during each of waveform phases P1 through P4 to effectuate a "voltage divider" action.

Typically, $+Vr$ would be $+5$ volts and $-Vr$ would be $-5$ volts; one unit of voltage would then be 5/128 volts, i.e., the size of the quantizing step would be 39 millivolts. During the positive phase of waveform P1, switches P1-1 and P1-2 close, connecting voltage-divider capacitors MC8+ and MC8− of the input stage to the high and low reference voltages $+Vr$ and $-Vr$, respectively. (For convenience, all ensuing references to the waveforms of FIG. 2 will be assumed to intend the positive phase or half-cycle portion thereof, unless otherwise noted. Further, voltage $+Vr$ may be assumed to be $+128$ units of voltage and voltage $-Vr$ may be assumed to be $-128$ units of voltage. These values will then explain the designations that have been applied to the various "bit weight" holding capacitors C+64, C−64, etc., hereinafter referred to.)

During phase P1, switches P1-3 and P1-4 of the second stage also close, connecting capacitors MC7+ and MC7− together and to capacitor $C_c$ via the Vo bus. The equal but opposite charges on these capacitors divide by charge redistribution to Vo thereby refreshing $C_c$ and effectively "short-circuiting" these capacitors to Vo. These capacitors are thereby discharged in preparation for being charged (during ensuing phase P2) from voltage divider capacitors MC8+ and MC8− of the input stage.

During phase P2, switches P2-1 and P2-2 close, connecting voltage-divider capacitors MC8+ and MC8−, respectively, of the input stage in parallel with voltage-divider capacitors MC7+ and MC7−, respectively, of the next stage. Since capacitors MC8+ and MC7+ are the same size, their parallel connection and ensuing charge redistribution causes capacitors MC8+ and MC7+ both to assume the same voltage; a voltage that is half that to which capacitor MC8+ had been charged during phase P1. Likewise, capacitors MC8− and MC7−, which are of the same size, both assume the same voltage during phase P2; a voltage that is half that to which capacitor MC8− was charged during phase P1.

During phase P3, switches P3-1 and P3-2 of the first stage close, causing the voltage on capacitor MC8+ to be applied to reference holding capacitor C+64 and the voltage on capacitor MC8− to be applied to reference holding capacitor C−64. Capacitors C+64 and C−64 may be larger than capacitors MC8+ and MC8−. The latter pair need not be matched, and the size is arbitrary, as long as C+64 and C−64 are much larger than the stray capacitance associated with switch S8C and the input capacitor of opamp 803C. The voltage on MC8+ is repeatedly divided to half of $Vr-Vo$, and then MC8 is switched in parallel with C+64. This charge redistribution action builds up the voltage on C+64 to $(Vr-Vo)/2$ and holds it there by repeated refresh from MC8. The voltage on C+64 is the binary weight value of +64 units of voltage. Similarly, the voltage on C−64 is driven to and held at $(-Vr+Vo)/2$ which is the binary weight value of −64 units of voltage. The voltage on reference holding capacitor C+64 appears at the upper-most terminal of switch S8C and the voltage on reference holding capacitor C−64 appears at the lower-most terminal of switch S8C.

Also during phase P3, switches P3-3 and P3-4 close, connecting voltage divider capacitor MC7+ of the second stage in parallel with voltage divider capacitor MC6+ of the third stage and connecting voltage divider capacitor MC7− in parallel with voltage divider capacitor MC6−. The parallel connection and redistribution of charge halves the voltages on capacitors MC7+ and MC7− so that, during phase P3, the voltage that will be established on capacitor MC6+ of the third stage will be one-quarter that of reference $+Vr$ (+32 voltage units) and so that the voltage that will be established on capacitor MC6− will be one-quarter that of reference $-Vr$ (−32 voltage units.) This operation of switches P3-3 and P3-4 occurring on phase P3 is analogous to the operation of switches P2-1 and P2-2 which occurred during phase P2.

During phase P4, switches P4-1 and P4-2 close, transferring the voltage established on voltage divider capacitors MC7+ and MC7− to holding capacitor C+32 and C−32 of the second stage. This is analogous to the "voltage build-up" and hold operation effected by switches P3-1 and P3-2 of the first stage, but occurring one "P" phase later. In this case, +32 voltage units and −32 voltage units are stored and held on C+32 and C−32, respectively.

The voltage-halving operation that occurs at each of the intervening fourth through seventh stages (not shown, but indicated by the dotted lines between the third and last stages) is analogous to the operation at each of the above-described first and second stages. During phase P3, a voltage divider operation takes place which establishes binary bit weight voltages on capacitors C+64 and C−64 of the first stage; during phase P4, reference voltages are established on capacitors C+32 and C−32; during phase P1, binary bit weight voltages are established on capacitors C+16 and C−16 of the third stage; and, similarly, during phase P2 binary bit weight voltages are established on capacitors C+½ and C−½ of the last or eighth stage.

Figure 3:
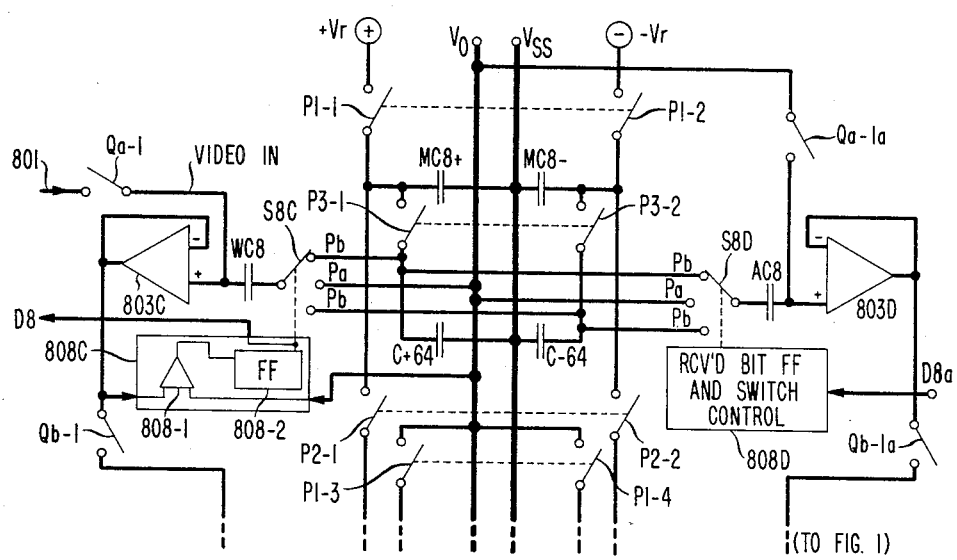
FIG 3 shows one stage of the encoder circuitry of FIG. 1 together with additional circuitry for decoding an input signal into an analog output signal.

Having described the voltage divider operations and the establishment of the binary bit weight voltages occurring on each of phases P1, P2, P3 and P4, reference should now be made to FIG. 3 which shows that, during phase P3, a positive half cycle of phase Pa occurs. During phase Pa, switch S8C of the input stage is at its mid-position, connecting the right-hand side of the input stage sampling capacitor WC8 to reference conductor Vo. Switch SC8 is shown as a single-pole triple-throw switch to illustrate that only one of the connections to WC8 can be made at a time. In practice this switch would be three single-pole single-throw switches with their right terminals all connected to WC8. Independent pulses are connected to these three switches. The switch connected to Vo is closed by Pa during P3. A logical AND gates, not shown, prevent the closure to either C+64 or C−64 during P3. During phase Pb, either the upper or lower connection is selected depending on whether FF 808-2 is set or reset as described later. During the phase Pa which coincides with phase P3, input switch Qa-1 is closed, applying the input analog signal from terminal 801 to the left-hand side of sampling capacitor WC8. The analog input voltage to which sampling capacitor WC8 charges is applied through operational buffer amplifier 803C to the left-hand input of comparator 808-1 of comparator and switch control circuit 808C.

The right-hand input of comparator 808-1 is connected to reference conductor Vo. Comparator 808-1 determines whether the input analog voltage being applied to sampling capacitor WC8 is positive or negative with respect to reference conductor Vo. Comparator 808-1 sets or resets flip-flop 808-2, accordingly.

During phase Pb which follows phase P3, comparator and switch control logic 808C moves switch S8C either to its upper-most or to its lower-most position. The reset state of flip-flop 808-2 will control switch S8C to its uppermost position while the set state will control switch S8C to its lower-most position. The state of flip-flop 808-2 appears on output terminal D8 out during this phase Pb which follows phase P3.

Accordingly, during the phase Pb which follows phase P3, if switch S8C is moved to its upper position, the positive voltage on holding capacitor C+64 (measured from reference conductor $V_{ss}$) will be added in series with the voltage on input stage sampling capacitor WC8. Conversely, if switch S8C is moved to its lower position, the negative voltage on capacitor C−64 is added in series (i.e., is subtracted from) the voltage on input stage sampling capacitor WC8.

During phase P4 which follows phase P3, switch Qb-1 closes, applying the resultant "bootstrapped" potential (measured from reference $V_{ss}$ to the left-hand terminal of sampling capacitor WC8) through buffer amplifier 803C to the left-hand terminal of sampling capacitor WC7 of the next stage.

Reference to FIG. 2 shows that, during phase P4, a positive half-cycle of phase Pb occurs. During phase Pb, switch S7C of the second comparator stage is in its center-most position and connects the right-hand side of sampling capacitor WC7 to the reference conductor Vo. Sampling capacitor WC7 charges to the bootstrapped potential received over switch Qb-1 from the first stage. Second stage comparator and switch controller circuit 707C determines whether the bootstrapped potential is positive or negative with respect to reference conductor Vo.

During the phase Pa which follows phase P4, comparator and switch control circuit 707C moves switch S7C to either its upper or lower position as determined by the bootstrapped potential applied to second stage sampling capacitor WC7 being either less or more positive than that of reference conductor Vo. In its upper position switch S7C adds the positive voltage on reference capacitor C+32 to the bootstrapped potential on sampling capacitor WC7. Conversely, if switch S7C is moved to its lower position, the negative voltage on reference capacitor C−32 is added in series (i.e., is subtracted from) the voltage on second stage sampling capacitor WC7. The set or reset state of the flip-flop (not explicitly shown) of comparator and switch control circuits 707C appears on second stage output terminal D7 during this phase Pa which follows phase P4.

During phase P1 which follows phase P4, switch Qa-2 closes, applying the further bootstrapped potential developed at the left-hand side of sampling capacitor WC7 to the left-hand side of sampling capacitor WC6.

Reference to FIG. 2 shows that, during phase P1, a positive half-cycle of phase Pa occurs. During phase Pa, switch S6C of the third comparator stage is in its center-most position and connects the right-hand side of sampling capacitor WC6 to the reference conductor Vo. Sampling capacitor WC6 charges to the bootstrapped potential received over switch Qa-2 from the second stage. Third stage comparator and switch control circuit 606C determines whether the bootstrapped potential is positive or negative with respect to the shared comparator reference voltage Vo. During the phase Pb which follows phase P1, the state of comparator and switch control circuit 606C appears on third stage output terminal D6. Likewise during each succeeding phase, a digital output appears at the "D−" terminal of the remaining comparator and switch control stages.

Returning to the consideration of the first stage, it will be recalled that the state of comparator and switch control circuit 808C appears at output terminal D8 during phase P4. During the next phase P1, switches P1-1 and P1-2 again close, recharging capacitors MC8+ and MC8− to the reference voltages +Vr and −Vr, respectively. During this phase P1, switches (not shown) may be employed temporarily shunt and thereby discharge sampling capacitor WC8. It should, of course, be appreciated that sampling capacitor WC8 need not be discharged if $C_c$ is very much larger than the WC− capacitors. In practice, it would be preferable to use a unity gain buffer between $C_c$ and a bus connecting to all of the Pa's. This provides a low impedance source of Vo serving as a virtual ground when the WC− and AC− capacitors are charged to the voltage being waved down the stages. The connection lines between switches driven by P−3 and P−4 pulses still connect to the bus leading to $C_c$. During the next phase P2, switches P2-1 and P2-2 close, halving the voltage on capacitors MC8+ and MC8−. During ensuing phase P3, switches P3-1 and P3-2 close, transferring the voltages established on capacitor MC8+ and MC8− to capacitors C+64 and C−64, respectively. At this time switch Qa-1 may again be closed to receive a new analog sample. Accordingly, during each repetition of phase P3, the circuitry of FIG. 1 may be employed to encode and therefore quantize a new analog input sample.

DECODER

FIG. 3 shows the first-stage of a compound coder/decoder which functions to convert an analog input at terminal 801 into the most significant digit of a digital output at terminal D8 and which also functions to convert the most significant digit of a digital input at terminal D8a into a partial analog sum output at switch Qb-1a. Succeeding stages (not shown) develop binary-weighted incremental additions and the summation analog signal is delivered to terminal Vd, FIG. 1. All of the circuitry to the left of the vertical line connecting switches P1-2 and P2-2 is identical to the first stage circuitry of the analog-to-digital encoder of FIG. 1. In accordance with this aspect of my invention, the voltage divider and reference capacitor circuitry of FIG. 1 may also be utilized together with a small amount of additional circuitry hereinafter to be described, to provide a pipe-line or sequentially operating digital-to-analog converter.

The additional circuitry for the first stage includes a 3-position switch S8D and a received bit flip-flop and switch control circuit 808D which operate quite similarly to 3-position switch S8C and comparator and switch control circuit 808C of the analog-to-digital encoder previously described. The flip-flop of circuit 808D serves to control the position of the single-pole, triple-throw switch in the same manner as 808-2. An accumulator capacitor AC8 is connected to the selector arm of switch S8D.

During phase Pa, the center arm of switch S8D connects the left-hand side of accumulator capacitor AC8 to bus Vo, while switch Qa-1a connects the right-hand side of the capacitor to bus Vo. Accumulator capacitor AC8 is thereby completely discharged.

During phase Pa, circuit 808D, which receives the most significant digital input bit at terminal D8a, sets or resets the flip-flop when the flip-flop is clocked. Circuit 808Q during phase Pb, controls switch S8D to the uppermost position if the digital input is a "1" or to its lower-most position if the digital input is a "0".

Accordingly, during phase Pb, accumulator capacitor AC8 is charged to the positive potential of reference holding capacitor C+64 if the D8 input was a "1" and is charged to the negative potential of reference holding capacitor C−64 if the D8 input was a "0".

When switch Qb-1a closes, buffer amplifier 803D passes the potential to which capacitor AC8 has been charged to the corresponding point of accumulator capacitor AC7 (not shown) of the second stage decoder which is similar to the first stage decoder circuitry just described. The accumulator capacitor AC7 of the second stage is first charged (with respect to Vo) to the voltage output of 803D. Then, the sum of this voltage and C+32 or C−32 bit weight holding capacitor of that stage, accordingly as the digital signal applied to the input of that stage is a "1" or a "0". Accordingly, as the digital "1" or "0" input is applied to the received bit flip-flop and switch controller circuitry of the succeeding stages, a binary-weighted voltage value is added or subtracted as the decoded signals propagate down the chain of accumulator capacitors. The result of the final decoder stage voltage addition or subtraction is applied to capacitor $C_d$ of FIG. 1.

What has been described is deemed illustrative of the principles of my invention. Numerous modifications may be made by those skilled in the art without, however, departing from the spirit and scope thereof.

For example, unity gain amplifiers may be used between various capacitors and the associated switches to reduce the effects of switching on the stored voltages. FIG. 1 shows that capacitors MC8+ and MC8− of the first stage during phase P1 to reference voltages +Vr and −Vr but the full magnitude of these voltages is never employed because switches P2-1 and P2-2 discharge these capacitors to one-half +Vr and one-half −Vr, respectively. Thus, capacitors MC8+ and MC8− of the first stage could be eliminated and switch S8C simply controlled to switch between a +64 volt source at its uppermost position and a −64 volt source at its lower position. In addition, one complete stage of FIG. 1 can be eliminated by connecting capacitor WC8 of the first stage in a reversing connection under control of comparator 808C. When the input analog signal is positive with respect to conductor Vo, the right-hand side of capacitor WC8 is connected to source −Vr. If the input analog signal is negative with respect to conductor Vo, capacitor WC8 is switched end-for-end.

It should also be apparent that the reference holding capacitors C+64 through C+½ and C−64 through C−½ may be eliminated altogether if operations are slowed down to match the divider chain rate. In this sort of connection, switch S8C would be at its center connection during phase P2 and switch Qa-1 would be closed during phase P2. During phase P3, switch S8C would be controlled to its upper or lower position by comparator 808C. Switch Qb-1 would close during phase P3 and switch S7C would be in its center-most position during phase P3. During phase P4 switch S7C would be controlled to either its upper or lower position and switch Qa-2 would close. Further and other modifications will also be apparent to those skilled in the art.

What is claimed is:

1. An analog-to-digital converter, comprising:
a plurality of stages each having
a comparator circuit,
a bit weight capacitance including first and second reference capacitors, and
an analog input sampling circuit;
a plurality of sequentially controlled switch means for, respectively,
charging the bit weight capacitance of a given one of said stages,
connecting together the analog input sampling and comparator circuits of said given one of said stages, and,
thereafter, selectively connecting the analog input circuit and bit weight capacitance of said given stage with the analog input sampling circuit of a succeeding one of said stages including selectively connecting either the first or second reference capacitors in series between said given one and said succeeding one of said stages.

2. An analog-to-digital converter according to claim 1 further comprising means for charging said first and second capacitors to opposite potentials.

3. An analog-to-digital converter according to claim 2 wherein said comparator means includes means for controlling said means for selectively connecting to connect said first of said bit weight capacitors when said analog input sampling circuit of said given stage exhibits one polarity analog input signal and said second of said bit weight capacitors when said analog input sampling circuit exhibits an analog input signal having a polarity opposite to said one polarity.

4. An analog-to-digital converter, comprising:
a plurality of stages each having
a comparator circuit,
a bit weight capacitance including first and second reference capacitors, and
an analog input sampling circuit;
a plurality of sequentially controlled switch means for, respectively,
charging the bit weight capacitance of a given one of said stages,
connecting together the analog input sampling and comparator circuits of said given one of said stages, and,
thereafter, selectively connecting the analog input circuit and bit weight capacitance of said given stage with the analog input sampling circuit of a succeeding one of said stages;
said means for selectively connecting said given and succeeding one of said stages includes;
means for selectively connecting either the first or second reference capacitors in series between said given one and said succeeding one of said stages, and
said means for selectively connecting said given and succeeding one of said stages is controlled by said comparator circuit.

5. An analog-to-digital converter, comprising:
a plurality of stages each having
a comparator circuit,
a bit weight capacitance,
a voltage divider capacitor, and
an analog input sampling circuit;
a plurality of sequentially controlled switch means comprising,
means including said voltage divider capacitor for charging the bit weight capacitance of a given one of said stages,
means for connecting together the analog input sampling and comparator circuits of said given one of said stages, and
means operative thereafter, for selectively connecting the analog input circuit and bit weight capacitance of said given stage with the analog input sampling circuit of a succeeding one of said stages.

6. An analog-to-digital converter accordingly to claim 5
wherein said sequentially controlled switch means for charging said bit weight capacitors includes means for initially charging said voltage divider capacitor of a given stage and, thereafter, connecting said voltage divider capacitors of said given stage in parallel with the voltage divider capacitor of a succeeding one of said stages.

7. An analog-to-digital converter according to claim 5
wherein said voltage divider capacitors of each of said stages are of the same value and wherein said bit weight capacitance is of significantly larger value than that of the stray capacitance of the associated switch means.

8. An analog-to-digital converter comprising
a plurality of stages each having:
first and second oppositely chargeable reference capacitors,
an analog input sampling circuit, and
a comparator circuit;
a plurality of sequentially controlled switch means for
(a) respectively connecting together the analog input sampling and comparator circuits of a given one of said stages, and,
(b) thereafter, selectively connecting the analog input circuit and either of said first or second reference capacitors of said given one of said stages with the analog input sampling circuit of a succeeding one of said stages.

9. An analog-to-digital converter comprising a plurality of stages each having; a first and second oppositely chargeable capacitor, an analog input sampling circuit and a comparator circuit;
means operable during a first phase to charge said capacitors of a given stage and to discharge the capacitors of a succeeding stage
means operable during a second phase for applying an input analog signal to said analog input sampling circuit of said given stage
means operable during a third phase under the control of said comparator circuit for connecting said input sampling circuit of said given stage to the input sampling circuit of a succeeding stage and selectively to either said first or said second one of said oppositely chargeable reference capacitors accordingly as said input analog signal is positive or negative.

* * * * *